United States Patent
Ke et al.

(10) Patent No.: US 12,245,391 B2
(45) Date of Patent: Mar. 4, 2025

(54) CASING ASSEMBLY, CARRIER, AND ELECTRONIC DEVICE

(71) Applicant: WISTRON CORP., New Taipei (TW)

(72) Inventors: Li Ke, New Taipei (TW); Yisheng Chen, New Taipei (TW); Siyun Tan, New Taipei (TW)

(73) Assignee: WISTRON CORP., New Taipei (TW)

( * ) Notice: Subject to any disclaimer, the term of this patent is extended or adjusted under 35 U.S.C. 154(b) by 337 days.

(21) Appl. No.: 17/672,800

(22) Filed: Feb. 16, 2022

(65) Prior Publication Data

US 2023/0180411 A1 Jun. 8, 2023

(30) Foreign Application Priority Data

Dec. 2, 2021 (CN) .......................... 202111462242.9

(51) Int. Cl.
*H05K 5/03* (2006.01)
*G06F 1/18* (2006.01)
(Continued)

(52) U.S. Cl.
CPC ............. *H05K 5/03* (2013.01); *H05K 5/0217* (2013.01); *H05K 5/0221* (2013.01);
(Continued)

(58) Field of Classification Search
CPC ....... G06F 1/183; G06F 1/184; H05K 7/1492; H05K 7/1424; H05K 7/1487; H05K 7/1409; H05K 7/1489; H05K 7/16; H05K 5/023; H05K 5/03; H05K 5/0221; H05K 5/0247; H05K 5/0204
See application file for complete search history.

(56) References Cited

U.S. PATENT DOCUMENTS

| 7,242,576 B2 * | 7/2007 | Coster .................... G06F 1/183 |
| | | 312/265.5 |
| 8,089,770 B2 * | 1/2012 | Olesiewicz ............. G06F 1/185 |
| | | 361/752 |

(Continued)

FOREIGN PATENT DOCUMENTS

| TW | M615842 | * | 8/2021 | ............... G06F 1/16 |
| TW | M615842 U | | 8/2021 | |

OTHER PUBLICATIONS

Chinese language office action dated May 18, 2022, issued in application No. TW 110146329.

*Primary Examiner* — Rockshana D Chowdhury
*Assistant Examiner* — Martin Antonio Asmat Uceda
(74) *Attorney, Agent, or Firm* — McClure, Qualey & Rodack, LLP

(57) ABSTRACT

A casing assembly is adapted for a carrier, the casing assembly includes a casing, an actuating component, and an engagement mechanism, the casing is adapted to be stacked on the carrier, the actuating component is disposed on the casing, the engagement mechanism includes a first component and a second component, the first component and the second component are connected to each other and are movably disposed on a surface of the casing, the actuating component is removably engaged with an end of the first component located away from the second component so as to cause the second component to be removably engaged with a first post of the carrier by pushing the first component.

19 Claims, 11 Drawing Sheets

(51) Int. Cl.
*H05K 5/02* (2006.01)
*H05K 7/14* (2006.01)

(52) U.S. Cl.
CPC ............ *H05K 5/0247* (2013.01); *H05K 7/14* (2013.01); *H05K 7/1417* (2013.01); *H05K 7/1422* (2013.01); *H05K 7/1427* (2013.01); *H05K 7/1488* (2013.01); *G06F 1/181* (2013.01)

(56) References Cited

U.S. PATENT DOCUMENTS

| | | | |
|---|---|---|---|
| 9,122,458 B2 * | 9/2015 | Yu | G06F 1/185 |
| 9,462,719 B2 * | 10/2016 | Wu | H05K 7/1487 |
| 9,674,978 B2 * | 6/2017 | Wu | G06F 1/185 |
| 9,753,504 B2 * | 9/2017 | Norton | G06F 1/183 |
| 9,826,658 B1 * | 11/2017 | Mao | G06F 1/183 |
| 10,064,299 B2 * | 8/2018 | Chen | H05K 7/1401 |
| 11,310,932 B2 * | 4/2022 | Chang | H05K 7/16 |
| 2005/0111178 A1 * | 5/2005 | Bradley | H05K 7/1411 360/99.06 |

* cited by examiner

CASING ASSEMBLY, CARRIER, AND ELECTRONIC DEVICE

CROSS-REFERENCE TO RELATED APPLICATIONS

This non-provisional application claims priority under 35 U.S.C. § 119(a) on Patent Application No(s). 202111462242.9 filed in China on Dec. 2, 2021, the entire contents of which are hereby incorporated by reference.

TECHNICAL FIELD

The disclosure relates to a fixing mechanism, more particularly to a casing assembly, a carrier and an electronic device.

BACKGROUND

A computer or server rack may contain one or more chassis for achieving effective and flexible utilization of internal space. Taking a tray in a chassis as an example, the tray is provided to support or accommodate circuit boards and other associated devices or modules, such that users is allowed to efficiently and quickly arrange the required devices or modules at the upper area of the chassis.

Typically, the tray is held in position by being pressed by a top cover installed onto the chassis, but the top cover is unable and often fails to secure the tray. As a result, the tray and the devices or modules thereon are easily displaced due to external force or impact. To prevent this, the tray may further adopt screws for firm fixation. However, there is not much area on the plate parts of the tray that is available for screw holes, thus the screw holes are generally arranged at the corners or along the edges of the tray. As such, only a part of the corners or lateral edges of the tray obtain support from the screws, but other areas of the tray, such as the flat bottom plate with a larger area, have no support and therefore are easily deformed due to the loading thereon, thereby affecting the stability of the devices and modules on the tray.

SUMMARY

Accordingly, one aspect of the disclosure is to provide a casing assembly, a carrier, and an electronic device which are capable of solving the aforementioned problems.

One embodiment of the disclosure provides a casing assembly, adapted for a carrier, the casing assembly includes a casing, an actuating component, and an engagement mechanism. The casing is adapted to be stacked on the carrier. The actuating component is disposed on the casing. The engagement mechanism includes a first component and a second component, the first component and the second component are connected to each other and are movably disposed on a surface of the casing, the actuating component is engaged with an end of the first component located away from the second component so as to cause the second component to be engaged with a first post of the carrier by pushing the first component.

Another embodiment of the disclosure provides an electronic device including a carrier and a casing assembly. The carrier has a first post. The casing assembly includes a casing, an actuating component, and an engagement mechanism. The casing is adapted to be stacked on the carrier. The actuating component is disposed on the casing. The engagement mechanism includes a first component and a second component, the first component and the second component are connected to each other and are movably disposed on a surface of the casing. the actuating component is engaged with an end of the first component located away from the second component so as to cause the second component to be engaged with a first post of the carrier by pushing the first component.

Another embodiment of the disclosure provides a carrier, adapted for a casing, the carrier includes a plate part, an actuating component, and an engagement mechanism. The actuating component is movably disposed on the plate part of the carrier. The engagement mechanism includes a first component and a second component, the first component and the second component are connected to each other and are movably disposed on the plate part, the actuating component contacts the first component so as to cause the second component to be engaged with a first post of the carrier by pushing the first component.

According to the casing assembly, the carrier, and the electronic device as discussed in the above embodiments of the disclosure, the operation of the actuating component can cause the first component of the engagement mechanism to move the second component and therefore cause the second component to engage with the first post. Thus, the engagement mechanism is able to obtain the support of the carrier for a specific area of the casing assembly. As such, the engagement mechanism makes it possible to create a connection between a wanted area of the casing and the carrier so as to effectively prevent the casing from deforming due to loading, vibration, or impact, thereby ensuring the stability of the devices or modules carried on the casing.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
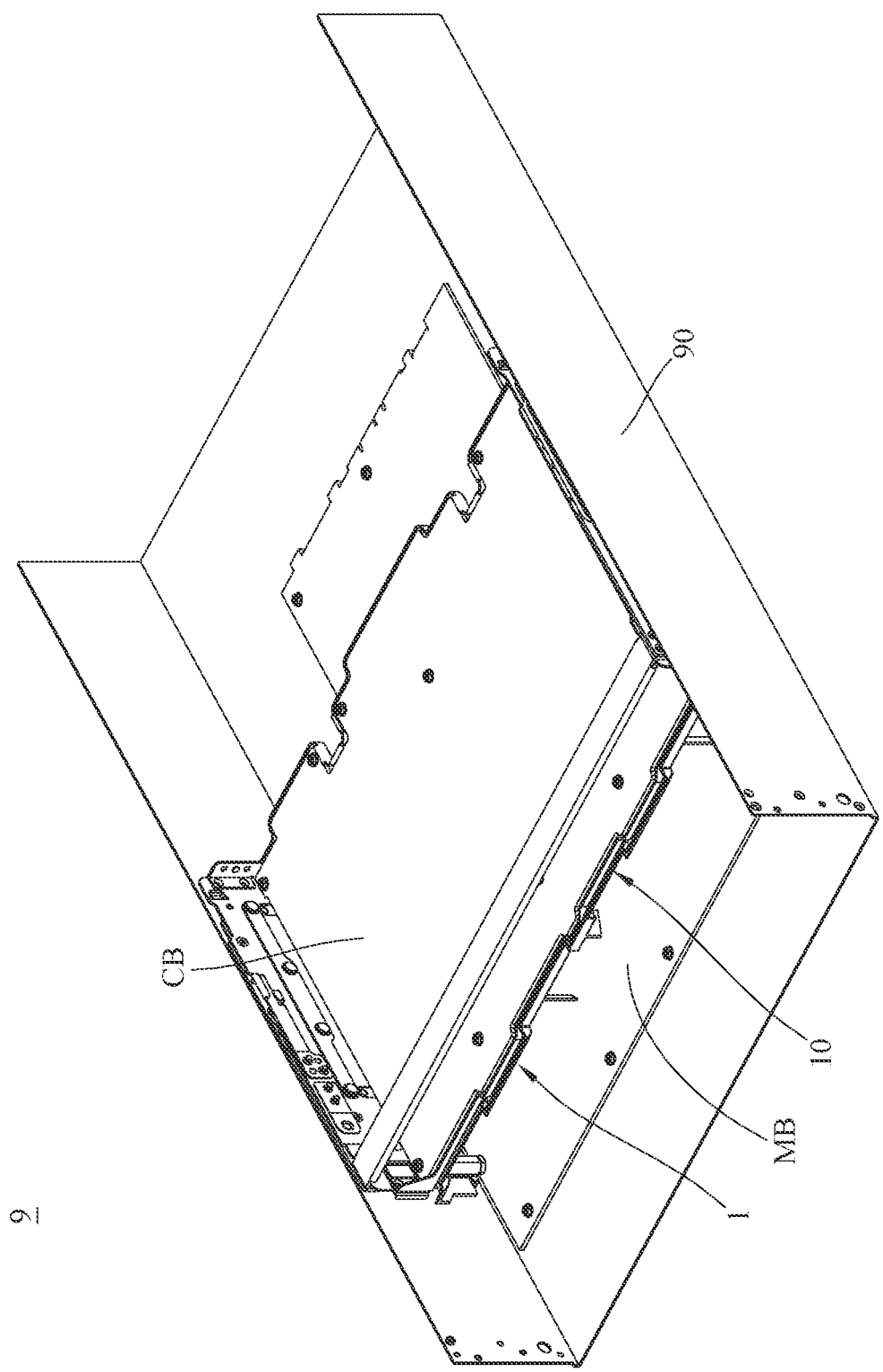
FIG. 1 is a perspective view of an electronic device according to one embodiment of the disclosure.

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

The following exemplary embodiments will be described with reference to FIGS. 1-11. For ease of explanation, some elements shown in the drawings may be simplified or illustrated by dotted lines, and other elements that are irrelevant to the spirit of the disclosure may be omitted.

Referring to FIG. 1, one embodiment of the disclosure provides an electronic device 9. The electronic device 9 may be, but is not limited to, a desktop computer, a server, or part of any one thereof, but the disclosure is not limited thereto. As shown, the electronic device 9 may include a carrier 90 and a casing assembly 1. The carrier 90 is configured to support or accommodate the casing assembly 1. The carrier 90 may support any other associated electronic component, assembly, casing, or frame structure, such as a mainboard MB shown in the drawings. The casing assembly 1 is detachably installed or stacked on the carrier 90. The casing assembly 1 is configured to support or accommodate any suitable electronic device or module for required function, such as a circuit board CB shown in the drawings. Note that the carrier 90, the mainboard MB, and the circuit board CB are provided for a better understanding of the casing assembly 1 and its function but are not intended to limit the disclosure, thus the disclosure is not limited by the configuration, number, and arrangement of these components.

Figure 2:
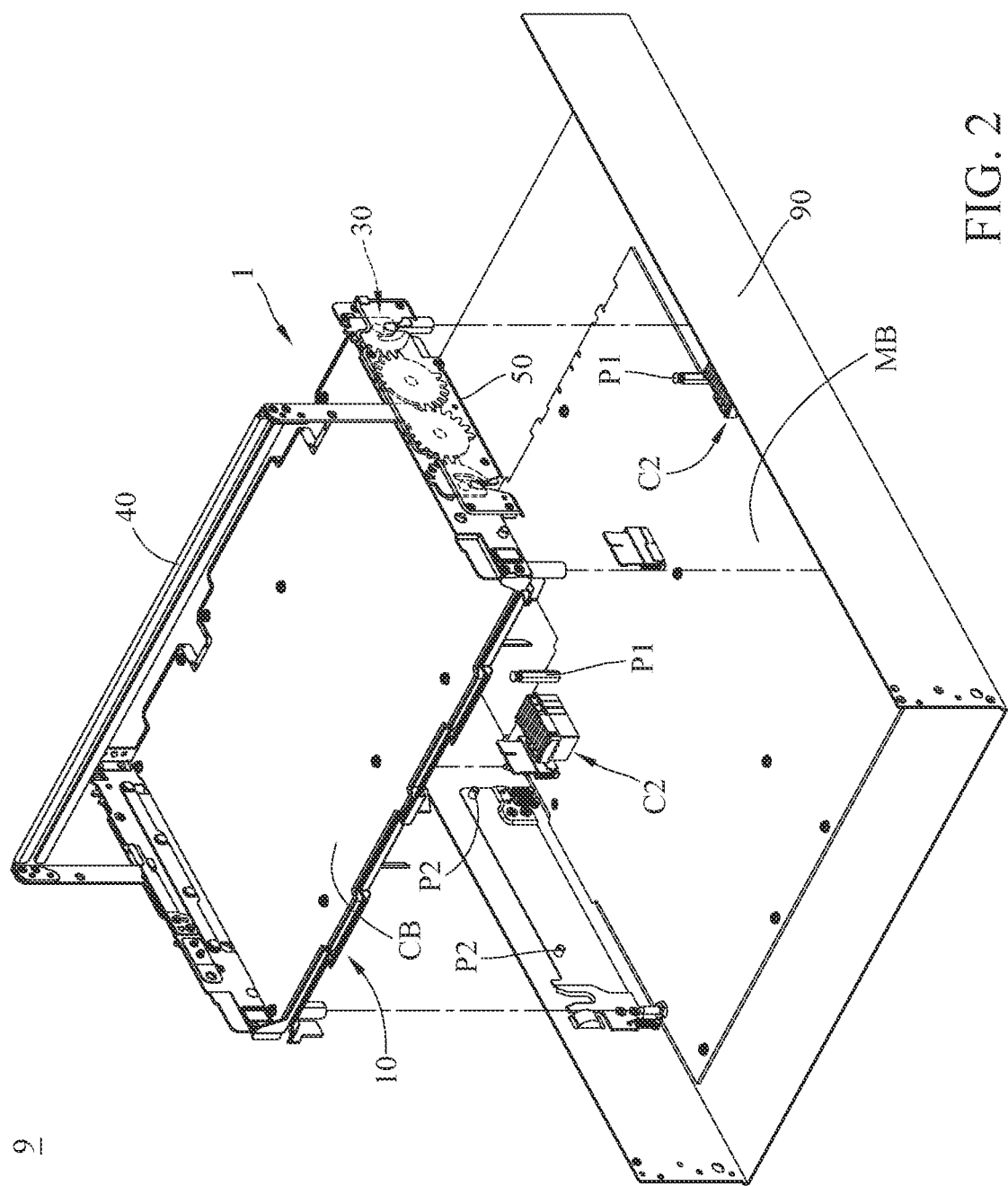
FIG. 2 is a perspective view of the electronic device according to one embodiment of the disclosure during the removal of a casing assembly.
Figure 3:
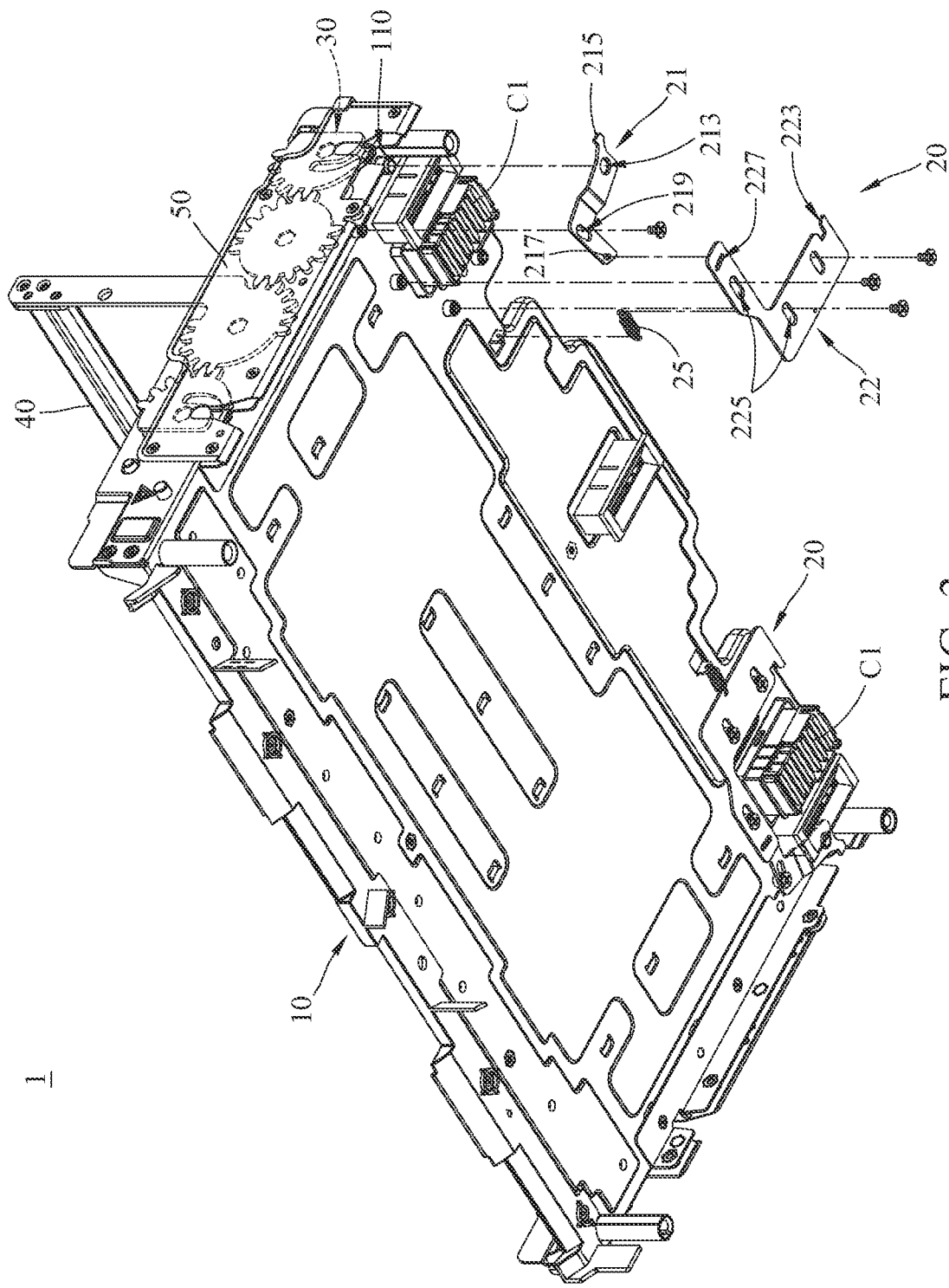
FIG. 3 is a partially exploded view of the casing assembly according to one embodiment of the disclosure.
Figure 4:
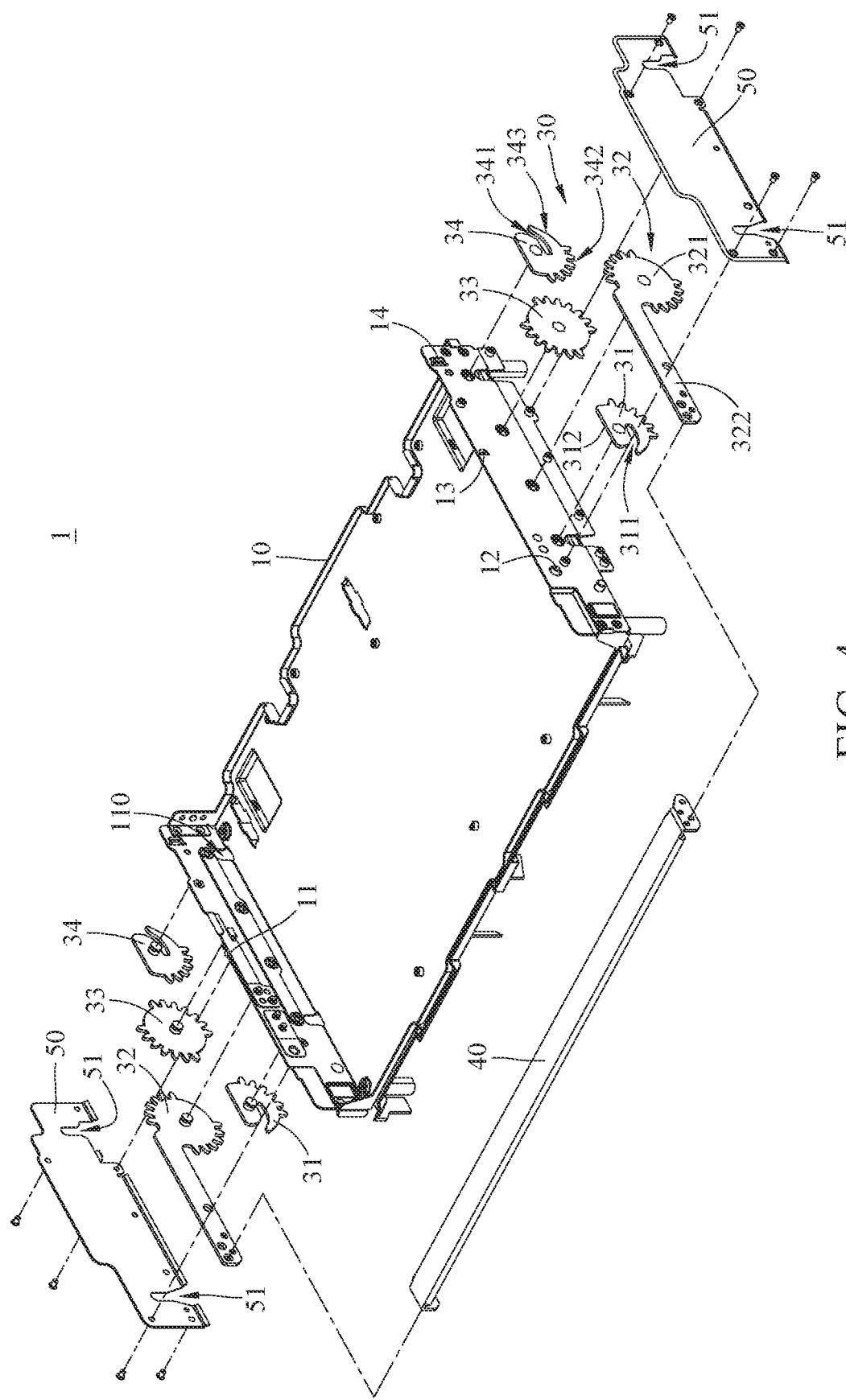
FIG. 4 is an exploded view of the casing assembly according to one embodiment of the disclosure.
Figure 5:
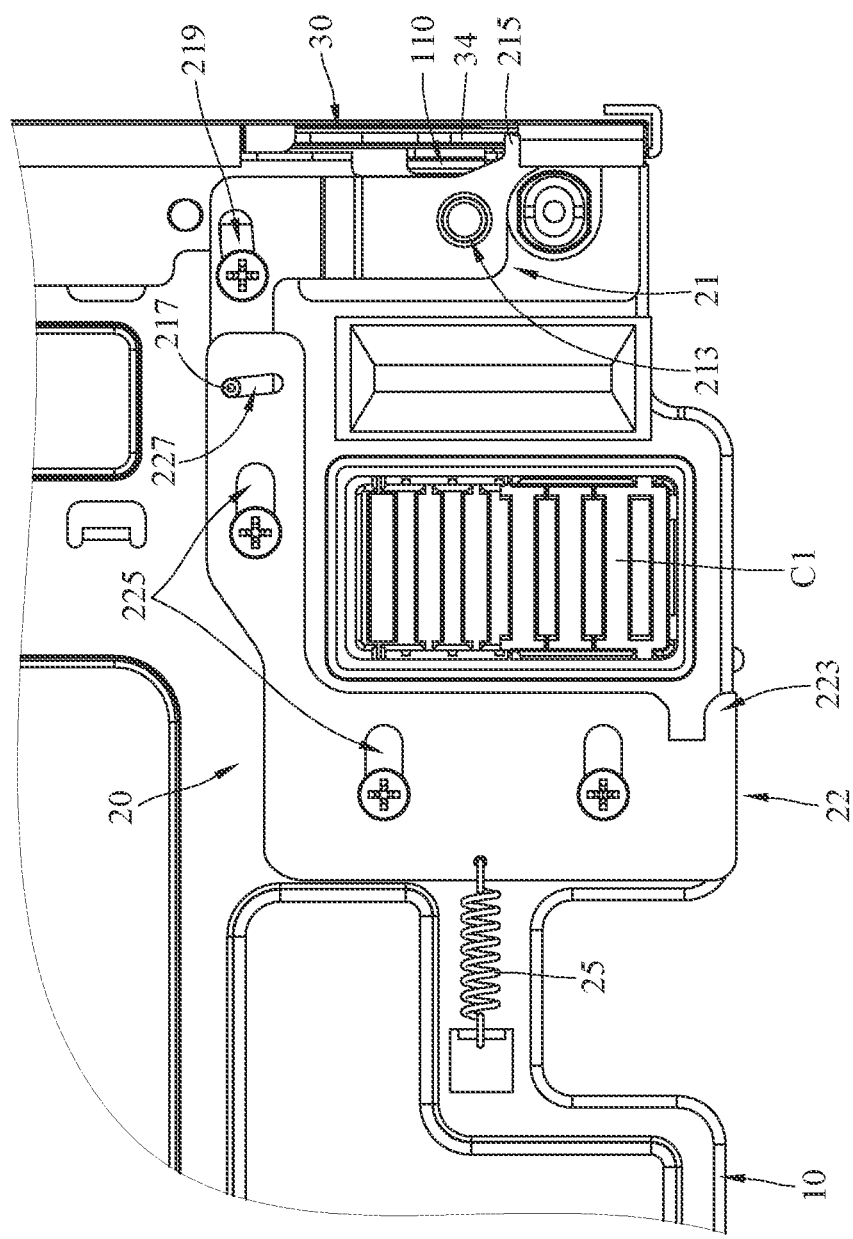
FIG. 5 is a partially enlarged view of the casing assembly according to one embodiment of the disclosure.
Figure 6:
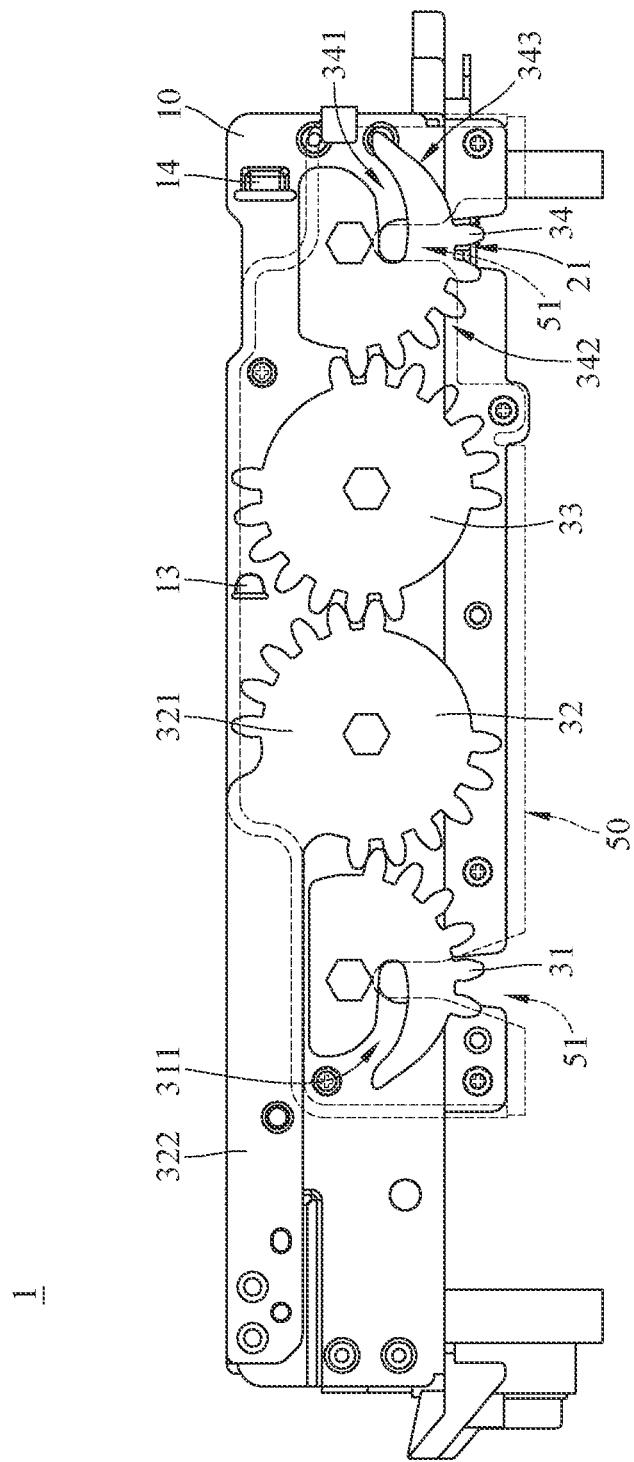
FIG. 6 is a side view of the casing assembly according to one embodiment of the disclosure.

The detail of the casing assembly 1 is provided with further reference to FIG. 2-6, where FIG. 2 is a perspective view showing that the casing assembly 1 is separated from the carrier 90, FIG. 3 is a partially exploded view of the casing assembly 1, FIG. 4 is an exploded view of the casing assembly 1, FIG. 5 is a partially enlarged view of the casing assembly 1, and FIG. 6 is a side view of the casing assembly 1. As shown, the casing assembly 1 may include a casing 10, at least one engagement mechanism 20, at least one gear set 30, a handle 40, and at least one side cover 50.

The casing 10 can be served as a tray suitable for supporting the circuit board CB. At least one first connector C1 is arranged on the circuit board CB. As shown, the first connectors C1 are disposed through or on the casing 10 and are electrically connected to the circuit board CB. The first connectors C1 are configured to be electrically connected to second connectors C2 on the mainboard MB. Thus, the circuit board CB and the mainboard MB can be electrically connected by connecting the first connectors C1 to the second connectors C2. Note that the first connectors C1 and the second connectors C2 may be any typical electrical connector and their number and arrangement are exemplary but not limiting.

Figure 7:
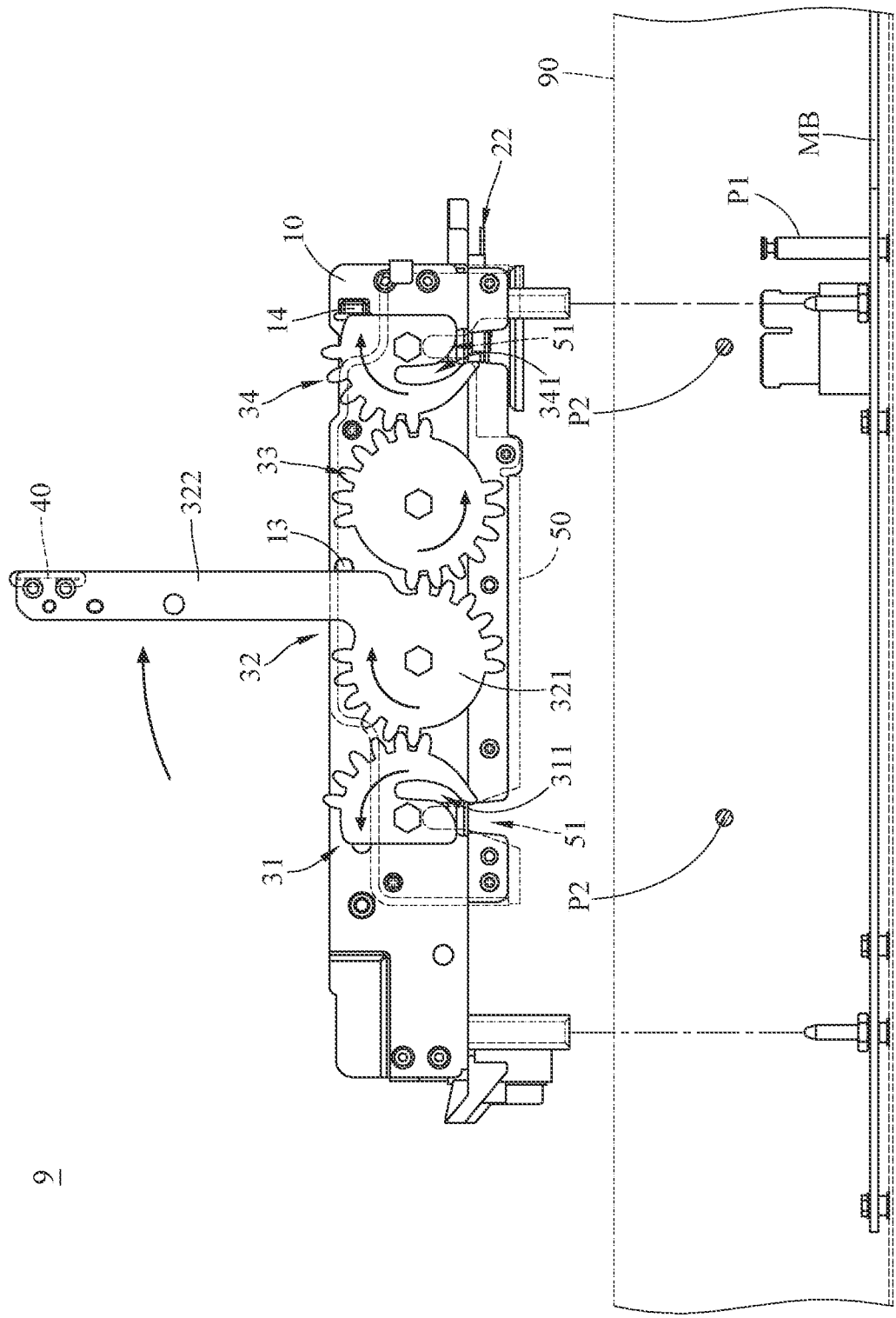
FIGS. 7-10 depict the operation of the casing assembly according to one embodiment of the disclosure.

The engagement mechanisms 20, the gear sets 30, and the side covers 50 are all arranged on the casing 10. Two opposite ends of each engagement mechanism 20 respectively extend toward two different sides of the casing 10. For example, the engagement mechanism 20 may extend toward two different sides of the casing 10 from the area near the first connector C1. The engagement mechanisms 20 are configured to be engaged with first posts P1 protruding from a bottom plate (not numbered) of the carrier 90. The first post P1 is a protrusion of any suitable form. For example, the first post P1 may be any suitable bolt used to fix the mainboard MB to the carrier 90. The gear sets 30 are respectively arranged at two opposite sides of the casing 10 and are configured to be engaged with second posts P2 protruding from sidewalls (not numbered) of the carrier 90. The gear sets 30 are able to cause the engagement mechanisms 20 to move. Two opposite ends of the handle 40 are pivotally connected to the casing 10 respectively via the gear sets 30. Thus, the handle 40 is pivotable with respect to the casing 10 and has a lying position (as shown in FIG. 1 or FIG. 6 discussed in later paragraphs) and a standing position (as shown in FIG. 2 or FIG. 7 discussed in later paragraphs). The operation of the handle 40 can cause the gear sets 30 to move the engagement mechanisms 20. There are two side covers 50 respectively cover the outer sides of the gear sets 30; in other words, the side cover 50 is disposed at the side of the gear sets 30 opposite to the casing 10. Note that the engagement mechanisms 20, the gear set 30, and the side cover 50 at the opposite sides of the casing 10 substantially have the same configuration; thus, only one engagement mechanisms 20, one gear set 30, and one side cover 50, that are located at one side of the casing 10, will be described in further detail in the following paragraphs.

Figure 8:
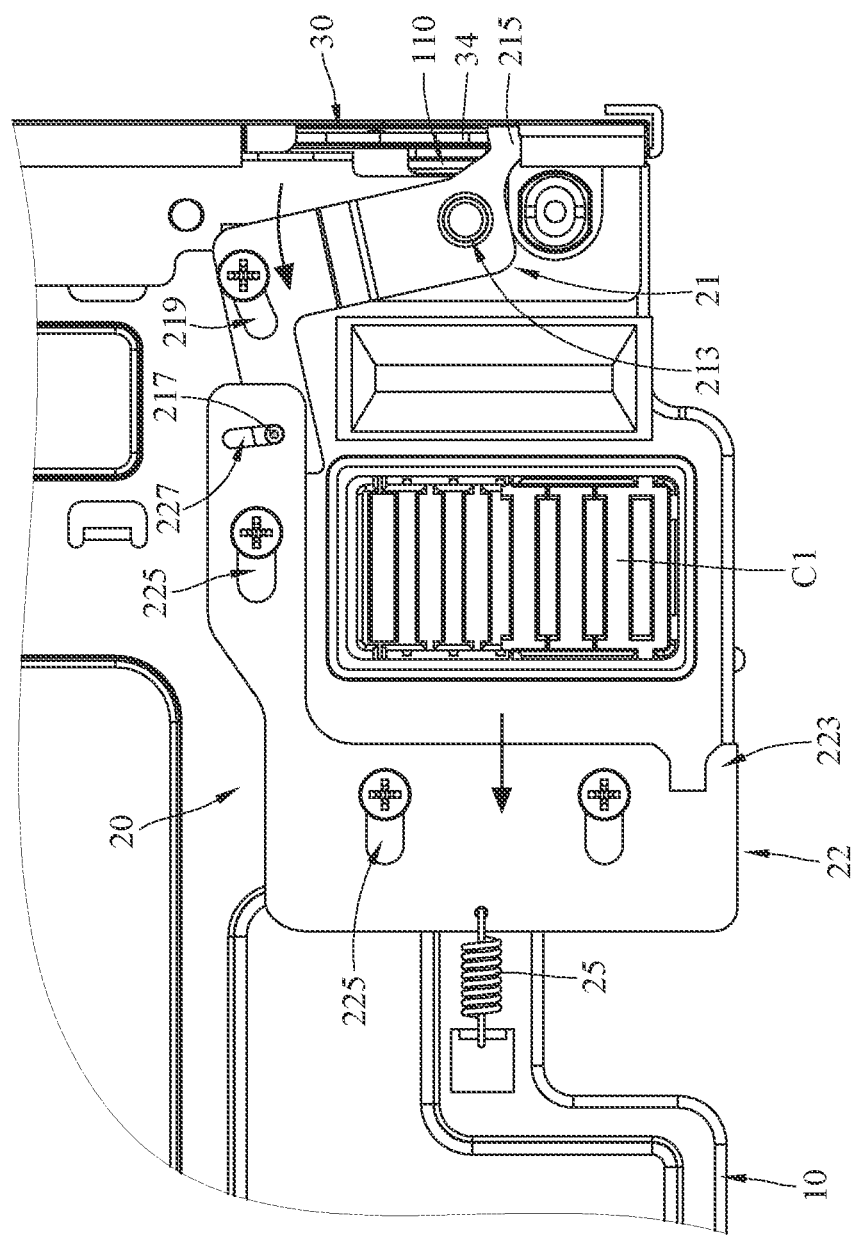
Figure 10:
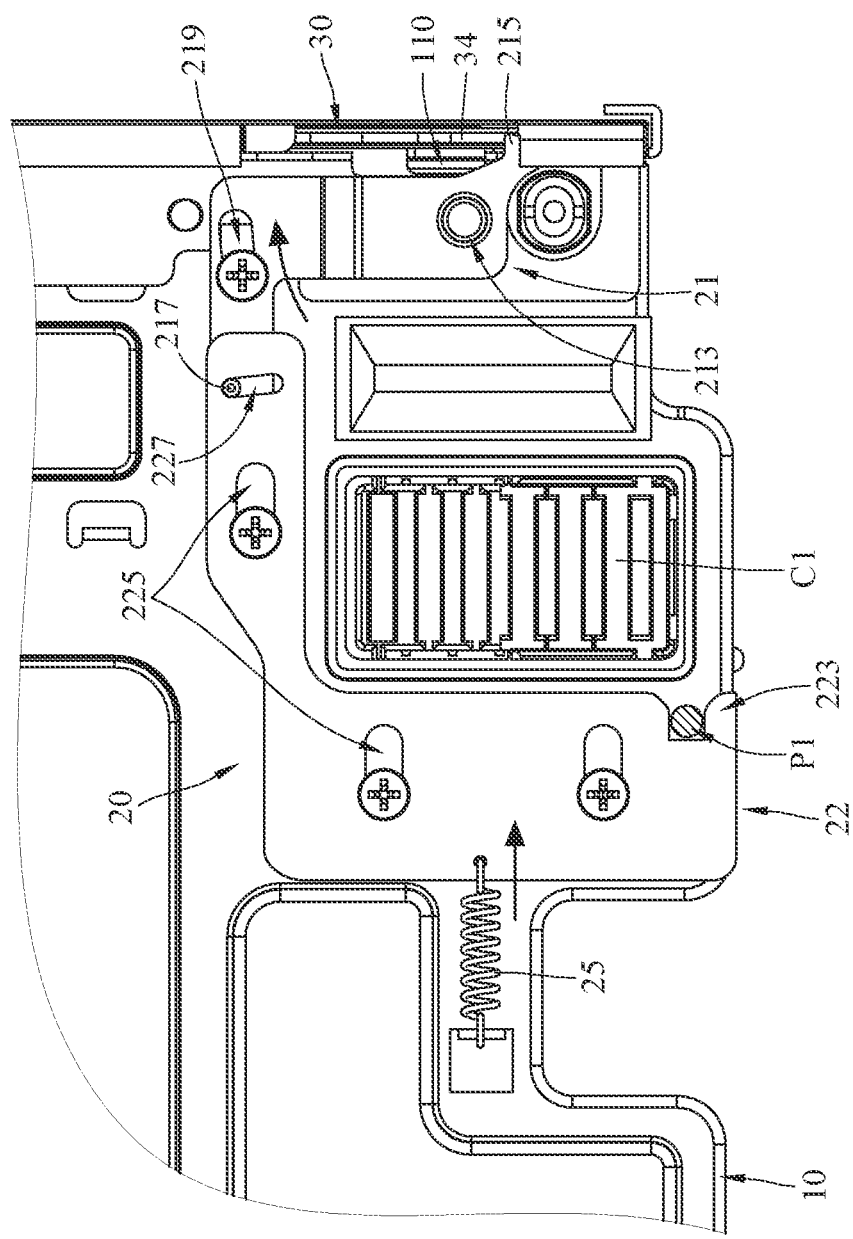
Figure 11:
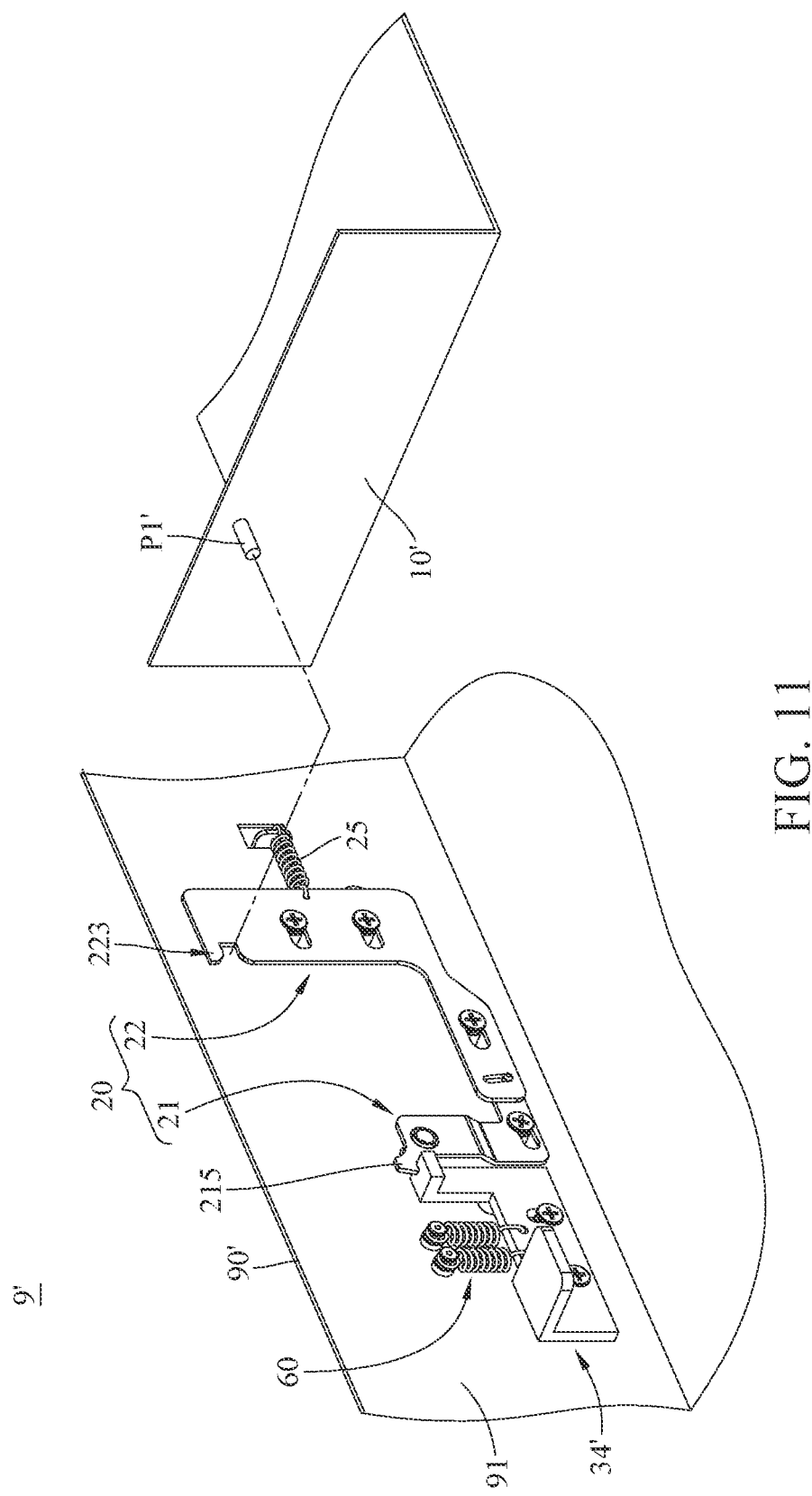
FIG. 11 is a partially enlarged exploded view of an electronic device according to another embodiment of the disclosure.

In this embodiment, the engagement mechanism 20 may include at least two components movably connected to each other. As shown, the engagement mechanism 20 may include a first component 21 and a second component 22 movably connected to each other. The first component 21 and the second component 22 are each a thin plate made of suitable material. The first component 21 and the second component 22 are movably disposed on the same surface of the casing 10. For example, the first component 21 and the second component 22 may be arranged at a surface of the casing 10 located away from the circuit board CB; in other words, the engagement mechanism 20 and the circuit board CB are respectively located at two opposite surfaces of the casing 10. One end of the first component 21 located away from the second component 22 is configured to contact the gear set 30, such that the first component 21 can be moved by the gear set 30. The second component 22 is movable by the first component 21 so as to be switchable between an engaging position (as shown in FIG. 5 or FIG. 10 discussed in later paragraphs) or a released position (as shown in FIG. 8 discussed in later paragraphs). When the second component 22 switches positions, one end of the second component 22 located away from the first component 21 is engaged with the first post P1 of the carrier 90.

In more detail, the first component 21 may include a mount portion 213, a contact portion 215, a first connecting portion 217, and a first guide portion 219. The mount portion 213 may be pivotally disposed on the casing 10 in any suitable manner and thus the mount portion 213 is considered to be the center of rotation of the first component 21. The contact portion 215 means the part of the first component 21 used to be in contact with or meshed with the gear set 30; in other words, the contact portion 215 is the part of the first component 21 used to directly receives the force from the gear set 30. The first connecting portion 217 means the part of the first component 21 used to be connected to the second component 22. The first guide portion 219 may be, but is not limited to, a curved slot whose center of curvature (not shown) is located at the mount portion 213. The first guide portion 219 is configured for the insertion of a suitable fastener (not numbered, e.g., a screw or bolt) fixed on the casing 10, thereby limiting the rotatable range of the first component 21 relative to the casing 10.

The second component 22 may include a hook structure 223, at least one second guide portion 225, and a second connecting portion 227. The hook structure 223 means the part of the second component 22 used to be engaged with the first post P1. The second guide portion 225 may be, but is not limited to, a straight slot extending in a specific direction. The second guide portion 225 is configured for the insertion of a suitable fastener (not numbered, e.g., a screw or bolt) fixed on the casing 10, thereby limiting the movable range of the second component 22 relative to the casing 10. The second connecting portion 227 means the part of the second component 22 used to be connected to the first connecting portion 217 of the first component 21. As shown, the first connecting portion 217 may be a protrusion, and the second connecting portion 227 may be a straight slot suitable for the insertion of the protrusion and is at an angle to the extension direction of the second guide portion 225 or to the movable direction of the second component 22.

In such an arrangement, the first component 21 and the second component 22 are movable in different directions, and the second component 22 can be switched to the engaging position or the released position when the contact portion 215 of the first component 21 is moved by the gear set 30. During the movement of the gear set 30, the first component 21 is moved relative to the casing 10 so that its first connecting portion 217 can cause the second component 22 to slide relative to the casing 10 and thereby causing the hook structure 223 of the second component 22 to engage with or move away from the gear set 30.

Additionally or optionally, the engagement mechanism 20 may further include at least one elastic component 25. The elastic component 25 may be, but is not limited to, any suitable extension spring. The elastic component 25 is connected to and located between the second component 22 and the casing 10 so as to force the second component 22 to move away from the first component 21, thus the elastic component 25 is able to keep the second component 22 staying in the released position when the first component 21 is not yet moved by the gear set 30.

The engagement mechanism 20 and the gear set 30 are arranged at different sides of the casing 10. For example, the gear set 30 and the engagement mechanism 20 may be respectively arranged at two adjacent sides of the casing 10. The gear set 30 may include a plurality of gear members. As shown, the gear set 30 may include a first gear member 31, a second gear member 32, a third gear member 33, and a fourth gear member 34 which may be pivotally disposed on the casing 10 in any suitable manner. The first gear member 31, the second gear member 32, the third gear member 33, and the fourth gear member 34 may each be rotatable about an axis that is substantially perpendicular to the axis of the first component 21 of the engagement mechanism 20 and is substantially parallel to the slidable direction of the second component 22 of the engagement mechanism 20. The first gear member 31 and the third gear member 33 are respectively meshed with two opposite sides of the second gear member 32, the second gear member 32 and the fourth gear member 34 are respectively meshed with two opposite sides of the third gear member 33; in other words, the first gear member 31, the second gear member 32, the third gear member 33, and the fourth gear member 34 arranged in a line at one side of the casing 10 and any one of them can cause others to rotate as well.

In more details, in this embodiment, the first gear member 31 may have a first engagement portion 311, the first engagement portion 311 may be a curved groove extending along a curved line whose center of curvature overlaps an axis of the first gear member 31. As shown, the curved groove has an opening formed at an edge of the first gear member 31, and the curved groove is recessed inwardly from the opening and has a closed end opposite to the opening. The phrase "recessed inwardly" used herein may indicate that the first engagement portion 311 extends in any direction away from the edge of the first gear member 31.

The second gear member 32 may include a gear portion 321 and an extension arm portion 322, the gear portion 321 is the part of the second gear member 32 being meshed with the first gear member 31 and the third gear member 33, the extension arm portion 322 extends away from the gear portion 321 in a direction away from the axis of the second gear member 32, the handle 40 is fixed to the second gear member 32 via the fixation to one end of the extension arm portion 322 so that the handle 40 is able to rotate the second gear member 32 and rotate other gear members via the second gear member 32. In this embodiment, the first gear member 31 may have a flat portion 312 at one side thereof to prevent interference with the extension arm portion 322 of the second gear member 32.

The third gear member 33 is substantially the same or similar to the gear portion 321 of the second gear member 32 and therefore is not repeatedly described herein. The fourth gear member 34 is substantially the same or similar to the first gear member 31, in other words, the first gear member 31 and the fourth gear member 34 share the same configuration, which is beneficial to reduce the development cost. Thus, similarly, the fourth gear member 34 may have a second engagement portion 341, the second engagement portion 341 may be a curved groove extending along a curved line whose center of curvature overlaps an axis of the fourth gear member 34. As shown, the curved groove has an opening formed at an edge of the fourth gear member 34, and the curved groove is recessed inwardly from the opening and has a closed end opposite to the opening.

Also, the fourth gear member 34 is the part of the gear set 30 used to directly contact and push the first component 21. Thus, to the engagement mechanism 20, the fourth gear member 34 can be considered as a trigger or an actuating component for actuating the engagement mechanism 20. In specific, the casing 10 may have at least one through hole 110 exposing the fourth gear member 34 to the contact portion 215 of the first component 21. The contact portion 215 of the first component 21 is disposed through the through hole 110 and meshed with the teeth (not numbered) of the fourth gear member 34; in other words, the contact portion 215 of the first component 21 is disposed through the casing 10 and located at the path of the teeth of the fourth gear member 34. Thus, the rotation of the fourth gear member 34 is able to force the first component 21 to move relative to the casing 10 so as to force the second component 22 to switch between the engaging position and the released position. Regarding the distribution of the teeth on the fourth gear member 34, there is a toothed area 342 and a toothless area 343 on an outer edge of the fourth gear member 34, the toothed area 342 means the area of the outer edge of the fourth gear member 34 with teeth while the toothless area 343 means the area of the outer edge of the fourth gear member 34 without teeth.

In this embodiment, the side cover 50 may be fixed to the casing 10 and located outside of the gear set 30 in any suitable manner, such that teeth of the first gear member 31, the second gear member 32, the third gear member 33, and the fourth gear member 34 are partially or almost located between the side cover 50 and the casing 10. This configuration is beneficial to prevent finger pinching caused by the gear set 30. The term "outside of the gear set" indicates the side of the gear set 30 opposite to or located away from the casing 10. In addition, corresponding to the first engagement portion 311 of the first gear member 31 and the second engagement portion 341 of the fourth gear member 34, the side cover 50 may have two guide holes 51. The guide holes 51 are recessed inwardly from an edge of the side cover 50 and therefore each has an opening at the edge of the side cover 50 and a closed end opposite to the opening. And the guide holes 51 at least expose part of the first engagement portion 311 and part of the second engagement portion 341.

Then, please refer to FIG. 6 and further refer to FIGS. 7-10, the operation of the casing assembly 1 is described in detail hereinafter. Firstly, as shown in FIGS. 6-7, the handle 40 can be pivoted to the standing position from the lying position as indicated by the arrow. When the handle 40 is in the standing position, the handle 40 is substantially perpendicular to the casing 10, allowing the user to grip and carry the casing 10.

In addition, during the movement of the handle 40 toward the standing position, the handle 40 rotates the extension arm portion 322 and the gear portion 321 of the second gear member 32 in the same direction, such that the handle 40 can simultaneously rotate the first gear member 31, the third gear member 33, and the fourth gear member 34 (as indicated by the arrows). By doing so, the second gear member 32 rotates the first gear member 31 and the fourth gear member 34 to a position where the openings of both the first engagement portion 311 and the second engagement portion 341 respectively correspond to the guide holes 51 of the side cover 50. Also, when the handle 40 reaches the standing position, the teeth of the fourth gear member 34 stay away from the contact portion 215 of the first component 21; in other words, the first component 21 is located at the toothless area 343 and not yet meshed with the fourth gear member 34. At this moment, the first component 21 may be in a position in slight contact with or in no contact with the fourth gear member 34, thus the elastic component 25 is able to keep the second component 22 and its hook structure 223 staying in the released position and away from the fourth gear member 34.

Then, as shown in FIGS. 7-8, the user can place the casing assembly 1 into the carrier 90 by holding the handle 40. To correctly place the casing assembly 1 into the carrier 90, the guide holes 51 of the side cover 50 may be aligned with the second posts P2 on the carrier 90. During the placement, the openings of both the first engagement portion 311 of the first gear member 31 and the second engagement portion 341 of the fourth gear member 34 correspond to the guide holes 51, thus, the second posts P2 can enter into the first engagement portion 311 and the second engagement portion 341 via these openings.

Also, with the cooperation of the second posts P2 and the first engagement portion 311 and the second engagement portion 341, the casing assembly 1 is ensured to be installed into the carrier 90 along a predetermined direction and path, thereby making the first connectors C1 of the circuit board CB on the casing 10 precisely aligned with and connected to the second connectors C2 of the mainboard MB. Meanwhile, the elastic component 25 keeps the second component 22 in the released position, thus the second component 22 does not hit or have physical interference with the first post P1 during the placement of the casing assembly 1 into the carrier 90.

Figure 9:
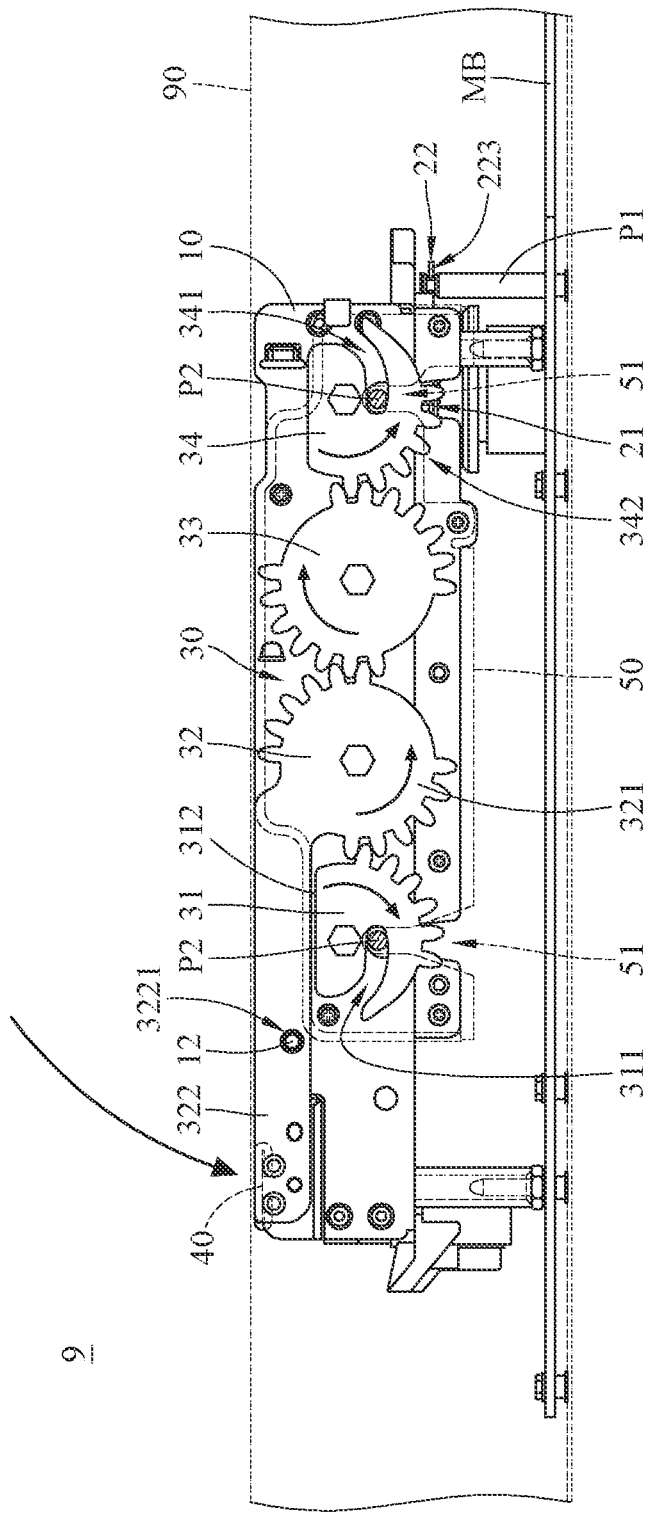

Then, as shown in FIG. 9, the handle 40 may be pivoted to the lying position (as indicated by the arrow), and the handle 40 rotates the second gear member 32 and therefore rotates the first gear member 31, the third gear member 33, and the fourth gear member 34 (as indicated by the arrow).

During the rotations of the first gear member 31 and the fourth gear member 34, the second posts P2 move towards the closed ends of the first engagement portion 311 and the second engagement portion 341; in other words, the gear set 30 engages with the second posts P2 on the carrier 90 via the first gear member 31 and the fourth gear member 34. As a result, the casing assembly 1 can be firmly fixed on the carrier 90, and therefore secures the electrical connection between the circuit board CB and the mainboard MB.

Also, as shown in FIG. 10, during the rotation of the fourth gear member 34, the contact portion 215 of the first component 21 is located at the path of the teeth of the fourth gear member 34, thus the teeth in the toothed area 342 of the fourth gear member 34 will mesh with the contact portion 215 and therefore causes the first component 21 to rotate relative to the casing 10, such that the second component 22 and its hook structure 223 are forced to move toward the fourth gear member 34 and then to engage with the first post P1 of the carrier 90. The engagements between the second component 22 and the first posts P1 provide support to the areas of the casing assembly 1 other than the support provided by the gear sets 30 at two opposite sides of the casing assembly 1.

As discussed, the installation of the casing assembly 1 can be realized in an efficient and toolless manner by simply operating the handle 40 thereof and therefore is beneficial to improve the efficiency of maintenance or relevant works. Also, two gear sets 30 provide four fixing points at different areas of the casing 10, which ensures or improves the reliability of the casing assembly 1. In addition, the casing assembly 1 also has the engagement mechanisms 20 capable of extending inwardly from two opposite sides of the casing 10 to obtain support from the carrier 90. As such, two opposite sides and one or more specific areas of the casing assembly 1 can be physically supported by carrier 90, thereby effectively preventing the casing 10 from deforming due to loading, vibration, or impact and ensuring the stability of the devices or modules carried on the casing 10. For example, the engagement mechanism 20 can be engaged to the first post P1 located near the first connector C1 so as to provide support to the area near the first connector C1, which helps prevent the plate part near the first connector C1 from deforming and therefore prevents any deformation from causing the first connector C1 to fall off.

It is understood that the idle space remaining in the computer casing or server casing is generally narrow for the space utilization concern, thus the first component 21 and the second component 22 of the engagement mechanism 20 are each a thin plate to fit this environment. The shapes of the first component 21 and the second component 22 allow the engagement mechanism 20 to be arranged through a narrow periphery space along the surface of the casing 10 so as to reach a specific area of the casing 10 and create a connection with the carrier 90.

Additionally or optionally, as shown in FIG. 4, the casing 10 may have at least one elastic stopper 11 protruding from sidewalls thereof. During the rotation of the handle 40 to the standing position from the lying position, the extension arm portion 322 may push and slide across the elastic stopper 11. As the handle 40 reaches the standing position, the elastic stopper 11 restores to its original shape and stops at one side of the extension arm portion 322 so as to hold the handle 40 in the current position, thereby preventing the handle 40 from unwantedly pivoting back to the lying position.

Additionally or optionally, as shown in FIG. 7, the casing 10 may have a stopper structure 13 protruding therefrom, the stopper structure 13 may stop at another side of the extension arm portion 322 when the handle 40 is in the standing position. Thus the stopper structure 13 can prevent the handle 40 from overly pivoted. Understandably, the elastic stopper 11 and the stopper structure 13 are able to secure the position of the handle 40 relative to the casing 10 when the casing assembly 1 is being carried around.

Additionally or optionally, as shown in FIG. 7, the casing 10 may further have a stopper structure 14 protruding therefrom, the stopper structure 14 is able to stop the fourth gear member 34 at the current position when the handle 40 reaches the standing position. Thus, stopper structure 14 can indirectly help stop the handle 40 at the standing position and prevent the handle 40 from overly pivoted.

Additionally or optionally, to retain the handle 40 in the lying position, as shown in FIGS. 4 and 9, the extension arm portion 322 of the second gear member 32 may have a first retaining structure 3221, and the casing 10 may have a second retaining structure 12 corresponding to the first retaining structure 3221, where one of the first retaining structure 3221 and the second retaining structure 12 is a protrusion, and the other one of the first retaining structure 3221 and the second retaining structure 12 is a hole mating the protrusion. As such, when the handle 40 is in the lying position, the first retaining structure 3221 and the second retaining structure 12 are able to engage with each other to retain the handle 40 in the current position.

Note that the disclosure is not limited by the order of the gear members of the aforementioned gear sets; in the gear set of some other embodiments, the first to fourth gear members may be arranged in another order as required. It is also noted that the location of the engagement mechanism and how to activate it may be changed as required. For example, please see an electronic device 9' illustrated in FIG. 11. For the purpose of simple illustration, only the main differences between this and the previous embodiments are provided herein. As shown, the engagement mechanism 20 may be arranged at a plate part 91 of a carrier 90' of the electronic device 9', the engagement mechanism 20 is able to be engaged with a casing 10' of the electronic device 9', and engagement mechanism 20 may be moved by an actuating component 34' slidably disposed on the plate part 91 of the carrier 90'.

In specific, the carrier 90' and the casing 10' may be, but is not limited to, any two independent structures arranged in the electronic device 9'. For example, as shown, the casing 10' is removably accommodated in or stacked on the carrier 90'. The casing 10' has a first post P1' protruding outwardly from one surface thereof. The first component 21 and the second component 22 of the engagement mechanism 20 are movably arranged on the plate part 91 of the carrier 90'. The plate part 91 may be a side plate, bottom plate, or top plate of the carrier 90'. When the casing 10' is disposed on the carrier 90', the hook structure 223 of the second component 22 of the engagement mechanism 20 is able to engage with the first post P1'. The actuating component 34' is also movably arranged on the plate part 91 of the carrier 90' and is suitable to be pressed or pushed by finger. The actuating component 34' is configured to move the second component 22 by pushing the contact portion 215. In addition, the electronic device 9' may further include at least one elastic component 60 connected to the plate part 91 of the carrier 90' and the actuating component 34'. The elastic component 60 may be, but is not limited to, any suitable extension spring. The elastic component 60 is configured to restore the position of the actuating component 34' so as to move the engagement mechanism 20 by moving the actuating component 34'.

In such an arrangement, as shown, when the actuating component 34' is not yet moved by the user, the elastic component 60 keeps the actuating component 34' in a specific position so that the actuating component 34' is in tight contact with the contact portion 215 of the first component 21, thereby holding the second component 22 at the engaging position. Thus, the hook structure 223 of the second component 22 is able to engage with the first post P1' on the casing 10' so as to secure the position of the casing 10' relative to the carrier 90'.

On the other hand, when the actuating component 34' is pushed and moved away from the first component 21, the elastic component 25 then is allowed to pull and switch the second component 22 to the released position, thereby This can cause the hook structure 223 to release the first post P1' so as to release the casing 10' from the carrier 90'.

As discussed, the engagement mechanism of the aforementioned embodiments is able to extend the push of the user from one casing to a required area of another casing and build a connection between these two chassis. Thus, as required, in other embodiments, the engagement mechanism may be arranged at the bottom plate or top cover of the carrier. In addition, considering the location of the fixing point that requires the engagement mechanism to reach, the engagement mechanism may involve more suitable components based on the aforementioned discussions.

According to the casing assembly, the carrier, and the electronic device as discussed in the above embodiments, the handle is pivotally connected to the casing via a gear set that is configured to engage with the carrier, thus the installation of the casing to the carrier can be efficiently achieved by simply operating the handle without the use of any tool, which is beneficial to improve the efficiency of maintenance or relevant works.

Also, the operation of the actuating component can cause the first component of the engagement mechanism to move the second component and therefore cause the second component to engage with the first post. Thus, the engagement mechanism is able to obtain the support of the carrier for a specific area of the casing assembly. As such, the engagement mechanism makes it possible to create a connection between a wanted area of the casing and the carrier so as to effectively prevent the casing from deforming due to loading, vibration, or impact, thereby ensuring the stability of the devices or modules carried on the casing.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly, adapted for a carrier, the casing assembly comprising:
   a casing, adapted to be stacked on the carrier;
   an actuating component, disposed on the casing; and
   an engagement mechanism, comprising a first component and a second component, wherein the first component and the second component are connected to each other and are movably disposed on a surface of the casing;
   wherein the actuating component is engaged with an end of the first component located away from the second component so as to cause the second component to be engaged with a first post of the carrier by pushing the first component;
   wherein the actuating component and the engagement mechanism are disposed on different sides of the casing, respectively.

2. The casing assembly according to claim 1, wherein the first component is rotatably disposed on the casing, and the second component is slidably disposed on the casing.

3. The casing assembly according to claim 2, further comprising at least one gear member, the at least one gear member and the engagement mechanism are respectively arranged at two adjacent sides of the casing, the at least one gear member is rotatably disposed on the casing, one of the at least one gear member is the actuating component, the actuating component is engaged with the first component of the engagement mechanism, and an axis of the actuating component is perpendicular to an axis of the first component.

4. The casing assembly according to claim 3, further comprising a handle rotatably connected to the casing via the at least one gear member and having a lying position and a standing position; when the handle is pivoted to the lying position from the standing position, the actuating component is engaged with the first component so as to cause the first component to move the second component to engage with the first post; when the handle is pivoted to the standing position from the lying position, the handle moves the first component via the at least one gear member, so as to cause the second component to release the first post.

5. The casing assembly according to claim 4, wherein the at least one gear member comprises a first gear member and a second gear member which are meshed with each other, the handle is connected to the casing and movable with the first gear member via the second gear member, the first gear member has a first engagement portion; when the handle is pivoted to the lying position, the handle causes the second gear member to rotate the first gear member so as to cause the first engagement portion to engage with one of second posts of the carrier.

6. The casing assembly according to claim 5, wherein the at least one gear member further comprises a third gear member engaged with the actuating component, the first gear member and the third gear member are respectively meshed with two opposite sides of the second gear member, the second gear member and the actuating component are respectively meshed with two opposite sides of the third gear member, the actuating component has a toothed area and a toothless area on an outer edge thereof; when the handle is in the standing position, the first component is located at the toothless area and is not meshed with the actuating component; when the handle is pivoted to the lying position from the standing position, teeth in the toothed area is meshed with the first component and cause the first component to engage another one of the second posts.

7. The casing assembly according to claim 6, wherein the actuating component has a second engagement portion; when the handle is pivoted to the lying position, the handle causes the second gear member and the third gear member to rotate the actuating component so as to cause the second engagement portion of the actuating component to engage with another one of the second post.

8. The casing assembly according to claim 1, further comprising at least one elastic component connected to and located between the second component and the casing; when the actuating component pushes the first component, the second component engages with the first post; when the actuating component releases the first component, the at least one elastic component cause the second component to release the first post.

9. The casing assembly according to claim 1, wherein the first component and the second component are each a thin plate.

10. An electronic device, comprising:
    a carrier, having a first post; and
    a casing assembly, comprising:
    a casing, adapted to be stacked on the carrier;
    an actuating component, disposed on the casing; and
    an engagement mechanism, comprising a first component and a second component, wherein the first component and the second component are connected to each other and are movably disposed on a surface of the casing;
    wherein the actuating component is engaged with an end of the first component located away from the second component so as to cause the second component to be engaged with a first post of the carrier by pushing the first component;
    wherein the actuating component and the engagement mechanism are disposed on different sides of the casing, respectively.

11. The electronic device according to claim 10, wherein the first component is rotatably disposed on the casing, and the second component is slidably disposed on the casing.

12. The electronic device according to claim 11, wherein the casing assembly further comprises at least one gear member, the at least one gear member and the engagement mechanism are respectively arranged at two adjacent sides of the casing, the at least one gear member is rotatably disposed on the casing, one of the at least one gear member is the actuating component, the actuating component is engaged with the first component of the engagement mechanism, and an axis of the actuating component is perpendicular to an axis of the first component.

13. The electronic device according to claim 12, wherein the casing assembly further comprises a handle rotatably connected to the casing via the at least one gear member and having a lying position and a standing position; when the handle is pivoted to the lying position from the standing position, the actuating component is engaged with the first component so as to cause the first component to move the second component to engage with the first post; when the handle is pivoted to the standing position from the lying position, the handle moves the first component via the at least one gear member, so as to cause the second component to release the first post.

14. The electronic device according to claim 13, wherein the at least one gear member comprises a first gear member and a second gear member which are meshed with each other, the handle is connected to the casing and movable with the first gear member via the second gear member, the first gear member has a first engagement portion; when the handle is pivoted to the lying position, the handle causes the second gear member to rotate the first gear member so as to cause the first engagement portion to engage with one of at least one second post of the carrier.

15. The electronic device according to claim 14, wherein the at least one gear member further comprises a third gear member engaged with the actuating component, the first gear member and the third gear member are respectively meshed with two opposite sides of the second gear member, the second gear member and the actuating component are respectively meshed with two opposite sides of the third gear member, the actuating component has a toothed area and a toothless area on an outer edge thereof; when the handle is in the standing position, the first component is located at the toothless area and is not meshed with the actuating component; when the handle is pivoted to the lying position from the standing position, teeth in the toothed area is meshed with the first component and cause the first component to engage another one of the second posts.

16. The electronic device according to claim 15, wherein the actuating component has a second engagement portion; when the handle is pivoted to the lying position, the handle causes the second gear member and the third gear member to rotate the actuating component so as to cause the second engagement portion of the actuating component to engage with another one of the second post.

17. The electronic device according to claim 10, further comprising at least one elastic component connected to and located between the second component and the casing; when the actuating component pushes the first component, the second component engages with the first post; when the actuating component releases the first component, the at least one elastic component cause the second component to release the first post.

18. The electronic device according to claim 10, wherein the first component and the second component are each a thin plate.

19. The electronic device according to claim 10, further comprising a circuit board, wherein the circuit board and the engagement mechanism are respectively located at two opposite sides of the casing.

* * * * *